(12) United States Patent
Park

(10) Patent No.: US 7,898,782 B2
(45) Date of Patent: Mar. 1, 2011

(54) INVERTER

(75) Inventor: Dong hyun Park, Gyeonggi-do (KR)

(73) Assignee: LS Industrial Systems Co., Ltd., Seoul (KR)

( * ) Notice: Subject to any disclaimer, the term of this patent is extended or adjusted under 35 U.S.C. 154(b) by 1169 days.

(21) Appl. No.: 11/550,458

(22) Filed: Oct. 18, 2006

(65) Prior Publication Data

US 2007/0127170 A1 Jun. 7, 2007

(30) Foreign Application Priority Data

Dec. 2, 2005 (KR) .................... 20-2005-0034101 U

(51) Int. Cl.
*H02H 3/08* (2006.01)
(52) U.S. Cl. ........................................................ 361/88
(58) Field of Classification Search ...................... 361/88
See application file for complete search history.

(56) References Cited

U.S. PATENT DOCUMENTS

| 4,535,378 A | * | 8/1985 | Endo ............................... 361/18 |
| 6,288,595 B1 | * | 9/2001 | Hirakata et al. ............... 327/424 |
| 2006/0255762 A1 | | 11/2006 | Yun |

OTHER PUBLICATIONS

U.S. Appl. No. 11/550,087 to Lee, filed Oct. 17, 2006.

* cited by examiner

*Primary Examiner* — Jared J Fureman
*Assistant Examiner* — Nicholas Ieva
(74) *Attorney, Agent, or Firm* — Greenblum & Bernstein P.L.C.

(57) ABSTRACT

An inverter detects whether a fault that an over current is supplied to a load is generated when the inverter supplies AC power and operates the load, and uses a voltage between a collector and an emitter of a switching element for detecting whether an over current is supplied to the load. The inverter cuts off a switching control signal, switches DC power by a plurality of switching elements supplying AC power to the load, detects the generation of the fault by a plurality of fault detecting units using the voltage of both ends of the collector and the emitter of a plurality of switching elements, generates the switching control signal by a controlling unit that outputs the switching control signal to a switching operation unit, and detects the generation of a fault by any of the plurality of fault detecting units.

3 Claims, 4 Drawing Sheets

INVERTER

CLAIM FOR PRIORITY

This application is based on and claims priority to Korean Utility Model Application No. 20-2005-0034101 filed on Dec. 2, 2005 in the Korean Intellectual Property Office (KIPO), the entire contents of which are hereby incorporated by reference.

BACKGROUND OF THE INVENTION

1. Field of the Invention

The present invention relates to an inverter used for operating loads such as a three-phase induction motor, etc.

2. Description of the Related Art

Generally, an inverter is used for controlling the operation of loads such as an induction motor, etc. Said inverter converts an alternating current (hereinafter referred to as, "AC") power into a direct current (hereinafter, "DC") power by having a power supply unit. Then, said DC power operates the load by being switched to a plurality of switching elements by a switching unit and being converted into the AC power. An Insulated Gate Bipolar Transistor (IGBT) is widely used as said plurality of switching elements.

In such inverter, a torque and a rotating speed of the load are precisely controlled by controlling the switching time of said plurality of switching elements and varying the voltage and the frequency of the AC power supplied to the load.

When operating the load by the motion of said inverter, an over current supplied to said load may cause a fault of the load. Thus, the inverter has a fault detecting unit and detects whether the fault that the over current is supplied to the load is generated or not. If the fault detecting unit detects the generation of the fault, the switching elements of the inverter is stopped and prevents the load from being damaged by the over current.

Said fault detecting unit conventionally converts the current flowing to the load into the voltage at a current detecting resistance and detects the power flowing to the load by both ends of the voltage of the current detecting resistance by having the current detecting resistance in series between a power supply unit and a switching unit. Further, the fault detecting unit detects whether or not the fault for supplying the over current to the load is generated by comparing both ends of the voltage of said current detecting resistance with the predetermined standard voltage.

When the resistance value of said current detecting resistor is high, the power consumption in the current detecting resistance becomes large. Thus, said current detecting resistance is conventionally designed to have a low resistance value for reducing the power consumption at the current detecting resistor. Further, the generation of said fault is conventionally detected by using the difference between the voltage detected at both ends of the current detecting resistance when the normal current flows into the load and the voltage detected at both ends of the current detecting resistor when over current flows into the load.

By using the current detecting resistor having a low resistance value and detecting the generation of the fault by the voltage of both ends of the current detecting resistor, said switching unit may relatively exactly detect the generation of the fault when the capacity of the power supplied to the load is low.

However, when the capacity of a rated current supplied to the load by the switching unit is high, the switching unit cannot exactly detect the generation of the fault due to the power consumption generated at the current detecting resistor.

Therefore, a technique that can exactly detect the generation of fault of the switching elements without relating to the capacity of the rated current supplied to the load is necessary.

SUMMARY OF THE INVENTION

An objective of the present invention is to provide an inverter capable of precisely detecting the generation of the fault without relating to the capacity of the current switching the DC power by a plurality of switching elements and supplying it to a load.

Another object of the present invention is to provide an inverter capable of detecting whether each plurality of switching devices are normally operated, and when the generation of the fault is detected, judging to which switching element the fault is generated.

An IGBT which is a switching device generally used to the inverter has a characteristic for increasing the voltage between a collector and an emitter when over current more than the rated power flows.

The present invention detects the generation of the fault by using the above-mentioned characteristic of the switching element and has a plurality of fault detecting unit between the collector and the emitter of a plurality of switching elements, respectively. Said each plurality of fault detecting unit detects the voltage between the collector and the emitter of each switching elements and detects the generation of the fault by comparing the detected voltage with the predetermined reference voltage.

Further, the present invention generates the operating power together in order to prevent the generation of error for detecting the fault of a plurality of fault detecting units when a plurality of switching operation unit generate a switching signal. Said generated operating power is operated by being supplied to a corresponding fault detecting unit that detects the voltage between the collector and the emitter of the switching element being operated according to said switching signal.

Therefore, the inverter of the present invention comprises: a plurality of switching operation units that generate a switching signal according to a switching control signal; a switching unit wherein a plurality of switching devices switches the DC power according to the generated switching signal by said switching operation unit, respectively, and supplies the AC power to the load; a plurality of fault detecting unit that detects the generation of the fault by the voltage of both ends of the collector and the emitter of said plurality of switching devices; and a controlling unit that generates said switching control signal and outputs it to said switching operation unit when said load is operated and cut off said switching control signal when at least one among said plurality of fault detecting units detects the generation of the fault.

DETAILED DESCRIPTION OF THE INVENTION

Hereinafter, referring to attached drawings illustrating the preferred embodiments, an inverter in accordance with the present invention will be explained in detail. However, in describing the present invention, when a relevant published function and a specific description regarding the construction is judged to unnecessarily make the gist of the present invention unclear, the detailed description thereof will be omitted.

Figure 1:
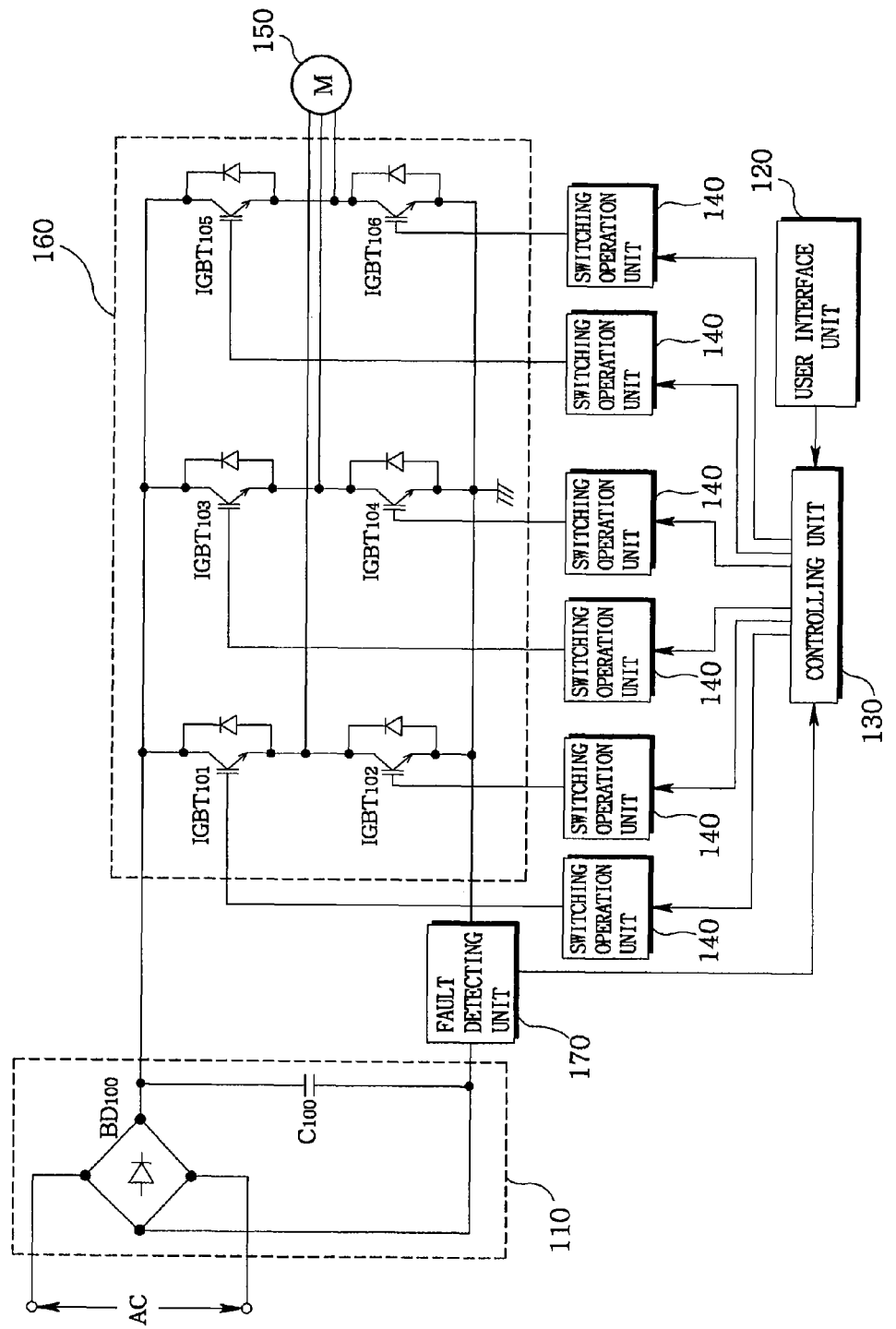
FIG. 1 is a circuit diagram showing a construction of a general inverter.

FIG. 1 is a circuit diagram showing a construction of a general inverter. Referring to FIG. 1, the inverter comprises a power supplying unit 110, a user interface unit 120, a controlling unit 130, a plurality of switching operation unit 140, a load 150, a switching unit 160 and a fault detecting unit 170.

Said power supplying unit 110 comprises a bridge diode $BD_{100}$ that generates an ripple power by bridge-rectifying the inputted AC power and a smoothing condenser that smoothes the echo power generated by said bridge diode $BD_{100}$ and generates the DC power.

Said user interface unit 120 comprises a plurality of function key (not shown) and generates an operation command according to the manipulation of the function key by the user.

Said controlling unit 130 controls the operation of the inverter according to the operating command generated by said user interface unit 120. Further, said controlling unit 130 generates the switching control signal and operates the inverter, and when said fault detecting unit 170 detects the generation of the fault, stops the operation of the inverter by cutting off said switching control signal.

Said plurality of switching operation units 140 generate the switching signal according to said switching control signal generated by said controlling unit 130, respectively. For instance, said switching signal is generated as a Pulse Width Modulation (PWM).

Said switching unit 160 connects with a plurality of switching devices ($IGBT_{101}$, $IGBT_{102}$) ($IGBT_{103}$, $IGBT_{104}$) ($IGB_{105}$, $IGBT_{106}$) in series between both terminals of said smoothing condenser $C_{100}$, respectively, and connects with an output terminal of said plurality of switching operation unit 140, at the gate of each plurality of switching devices ($IGBT_{101}$, $IGBT_{102}$) ($IGBT_{103}$, $IGBT_{104}$) ($IGBT_{105}$, $IGBT_{106}$), respectively, and thereby applies the switching signal outputted by a plurality of switching operation unit 140 to each gate of a plurality of switching elements ($IGBT_{101}$, $IGBT_{102}$) ($IGBT_{103}$, $IGBT_{104}$) ($IGBT_{105}$, $IGBT_{106}$), respectively.

Said fault detecting unit 170 detects the generation of the fault by the current that flows from said switching unit 160 to said smoothing condenser $C_{100}$ and generates the fault detecting signal. The fault detecting signal generated at said fault detecting unit 170 is inputted to said controlling unit 130.

The inverter having such construction converts the inputted AC power into the ripple power by the bridge-rectifying of the bridge diode $BD_{100}$ of the power supplying unit 110 and the ripple power is converted into the DC power by being smoothed at the smoothing condenser $C_{100}$.

The DC power smoothed at said smoothing condenser $C_{100}$ is supplied to the switching unit 160 as an operating power.

If the user commands the operation of the inverter by manipulating the user interface unit 120, the controlling unit 120 selectively generates a plurality of switching control signals. According to said generated switching control signals, a plurality of switching operation units 140 generate the switching signal, respectively, and the generated switching signal is applied to each gate of the switching elements ($IGBT_{101}$, $IGBT_{102}$) ($IGBT_{103}$, $IGBT_{104}$) ($IGBT_{105}$, $IGBT_{106}$) of the switching unit 160.

Then, the switching elements ($IGBT_{101}$, $IGBT_{102}$) ($IGBT_{103}$, $IGBT_{104}$) ($IGBT_{105}$, $IGBT_{106}$) are selectively turned on and off according to the switching signal, and according to the on and off of the switching elements ($IGBT_{101}$, $IGBT_{102}$) ($IGBT_{103}$, $IGBT_{104}$) ($IGBT_{105}$, $IGBT_{106}$), the DC power supplied at said power supplying unit 110 is switched and converted into the three-phase AC power, and the three-phase AC power is supplied to the load 150 and operates the load.

As mentioned above, if the three-phase AC power is supplied and operates the load 150, the current becomes flow from the switching unit 160 to the smoothing condenser $C_{100}$ through the fault detecting unit 170. Said fault detecting unit 170 detects the dimension of the current flowing from the switching unit 160 to the smoothing condenser $C_{100}$ and generates the fault detecting signal by detecting whether the fault is generated or not by the dimension of the detected power. The fault detecting signal generated by said fault detecting unit 170 is inputted to the controlling unit 130.

Said controlling unit 130 judges whether the fault of the inverter is generated by the fault detecting signal generated by said fault detecting unit 170. Further, said controlling unit 130 protects the impairment of the load 150 by performing a certain operation regarding the fault generation when the generation of the fault of the inverter is judged. For instance, the controlling unit 130 does not output the switching control signal. Then, all of a plurality of switching operation units 140 do not generate the switching signal, and thereby all of a plurality of switching elements $IGBT_{101}$~$IGBT_{106}$ are not to be operated and the load 150 is not impaired because the three-phase AC power of the over current is not supplied.

Figure 2:
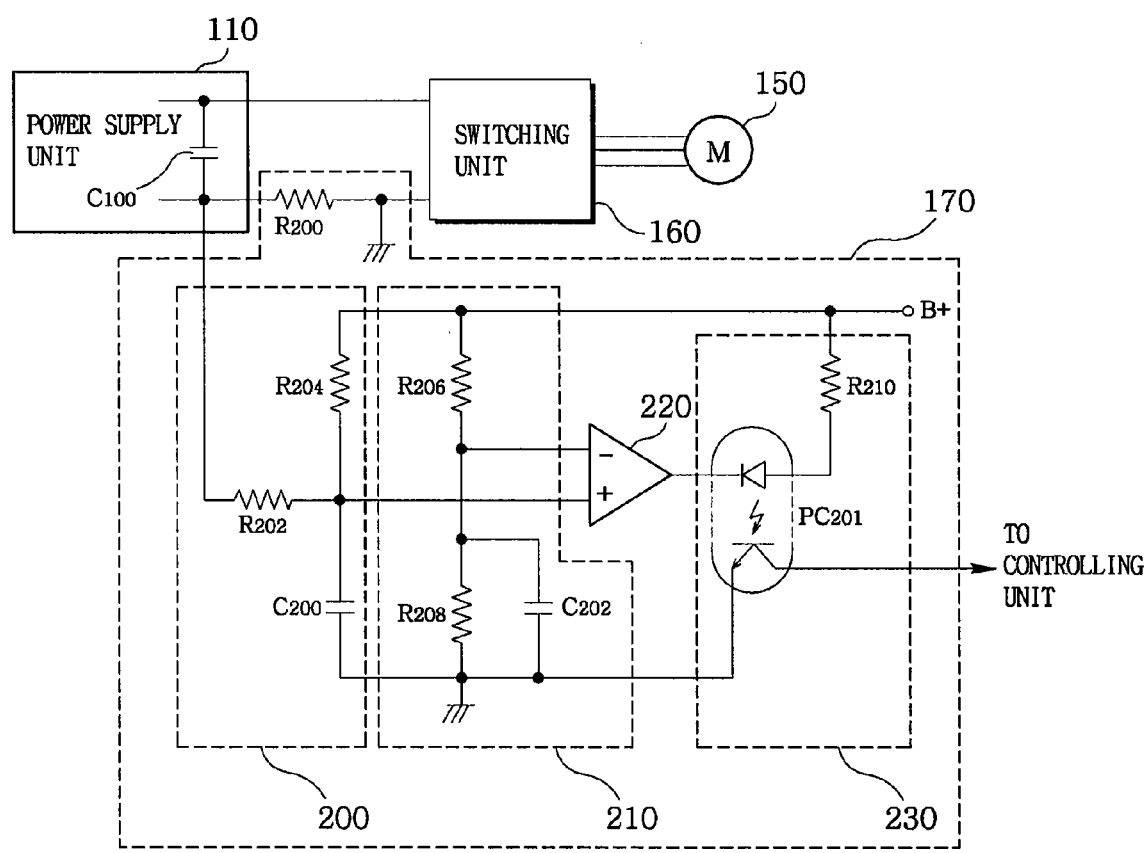
FIG. 2 is a detailed circuit diagram showing the construction of a fault detecting unit of the inverter of FIG. 1.

FIG. 2 is a detailed circuit diagram showing the construction of a fault detecting unit of the inverter of FIG. 1. Referring to FIG. 2, said fault detecting unit 170 comprises a current detecting resistor, a voltage detecting unit 200, a reference voltage unit 210, a comparator 220 and a fault detecting signal output unit 230.

Said current detecting resistance $R_{200}$ is connected between said switching unit 160 and said smoothing condenser ($C_{100}$) and converts the current flowing from the switching unit 160 to the smoothing condenser $C_{100}$ into the voltage.

Said voltage detecting unit 200 connects the resistance $R_{204}$ and the condenser $C_{200}$ between the power terminal $B^+$ and the ground in series and connects the resistance $R_{204}$ between the connecting point of said current detecting resistor $R_{200}$ and the smoothing condenser $C_{100}$ and the connecting point of said resistance $R_{204}$ and the condenser $C_{200}$. The connecting point of said resistance $R_{200}$, $R_{202}$ and the condenser $C_{200}$ is connected to a non-inverting input terminal (+) of said comparator 220.

Said reference voltage unit 210 connects the resistance $R_{206}$, $R_{208}$ between said power terminal ($B^+$) and the ground in series, connects the condenser $C_{202}$ to said resistance $R_{206}$ in parallel and connects the connecting point of said resistance $R_{206}$, $R_{208}$ and the condenser $C_{202}$ to an inverting input terminal (−) of said comparator 220.

Said fault detecting signal output unit 230 is connected to the output terminal of said comparator 220 by successively passing said power terminal ($B^+$) through the resistance $R_{210}$ and a radiating unit of a photo coupler $PC_{200}$. The emitter of a light-receiving transistor of said photo coupler $PC_{200}$ is connected to the ground and the collector of the light-receiving transistor of the photo coupler $PC_{200}$ is constructed for outputting the fault detecting signal.

The fault detecting unit 170 constructed as mentioned above divides the DC voltage applied to the power terminal (B+) by the resistance $R_{206}$, $R_{208}$ of the reference voltage unit 210 and stabilizes the voltage of both ends of the resistance $R_{208}$ by the condenser $C_{202}$. Said stabilized voltage of both end of said resistance $R_{208}$ supplies the reference voltage to the inverting input terminal (−) of the comparator 220.

In the above-mentioned state, the current flowing from said switching unit 160 to the smoothing condenser $C_{100}$ through the current detecting resistance $R_{200}$ for power detection is converted into the voltage at the current detecting resistance $R_{200}$. The voltage of both ends of said current detecting resistor $R_{200}$ is charged at the condenser $C_{200}$ through the resistance $R_{202}$ of the voltage detecting unit 200 and applies to the non-inverting input terminal (+) of the comparator 220 as a detective voltage.

Here, the values of the resistances ($R_{200}$~$R_{208}$) and the condenser ($C_{200}$, $C_{202}$) are established so that the detective voltage applied to the non-inverting input terminal (+) of the comparator 220 is higher than the reference voltage applied to the inverting input terminal (−) when said switching unit 160 normally performs the switching operation and supplies the rated three-phase AC power to the load 150 and the detective voltage applied to the non-inverting input terminal (+) of the comparator 220 is lower than the reference voltage applied to the inverting input terminal (−) when the switching unit 160 cannot normally supply the three-phase AC power to the load 150.

Then, when said switching unit 160 supplies the three-phase AC power having a normal power level to the load 150, the detective voltage applied to the non-inverting input terminal (+) of the comparator 220 is higher than the reference voltage applied to the inverting input terminal (−).

When said comparator 220 outputs the signal of high level, an emitting unit of the photo coupler $PC_{200}$ of the fault detecting signal output unit 230 does not become emit, and the light-receiving transistor of the photo coupler $PC_{200}$ cannot be turned on.

Further, when over current is supplied to the load 150 by the generation of the fault of said switching unit 160, the comparator 220 outputs the signal of the low level since the detective voltage applied to the non-inverting input terminal (+) of the comparator 220 becomes lower than the reference voltage applied to the inverting input terminal (−) in opposition to the above-mentioned case.

When said comparator 220 outputs the signal of the low level, the DC voltage of the power terminal (B⁺) successively passes through of the resistance $R_{210}$ and the emitting unit of the photo coupler $PC_{200}$ of the fault detecting signal output unit 230. Thus, the emitting unit of the photo coupler $PC_{200}$ is emitted, and the light of the emitting unit is received at the light-receiving transistor of the photo coupler $PC_{200}$ and is turned on, and according to the turn-on of the light-receiving transistor, the fault detecting signal of the low level is outputted to the collector of the light-receiving transistor and informs the generation of the fault to the controlling unit 130.

Then, the controlling unit 130 judges the generation of the fault of the inverter and stops the output of the switching control signal. According to the suspension of the output of the switching control signal by the controlling unit 130, the over current is not supplied to the load 150 any more since a plurality of switching operation units 140 do not output the switching signal and a plurality of switching elements $IGBT_{101}$~$IGBT_{106}$ do not perform the switching operation.

In such inverter, said fault detecting unit 170 comprises a current detecting resistor $R_{200}$ between a switching unit 160 and a smoothing condenser $C_{100}$ of the power supply unit 110 and detects the generation of the fault of the inverter by the voltage of both ends of the current detecting resistance $R_{200}$.

Therefore, the fault can exactly be detected when the current capacity supplied to the load 150 by being switched by the switching unit 160 is small.

However, when the current capacity supplied to the load 150 by the switching unit 160 is large, the fault cannot exactly be detected due to the low resistance value of the current detecting resistance $R_{200}$ and the loss generated in the current detecting resistance $R_{200}$.

Therefore, the fault of the inverter needs to exactly be detected without relating to the current capacity supplied to the load 150 by the switching unit 160.

Figure 3:
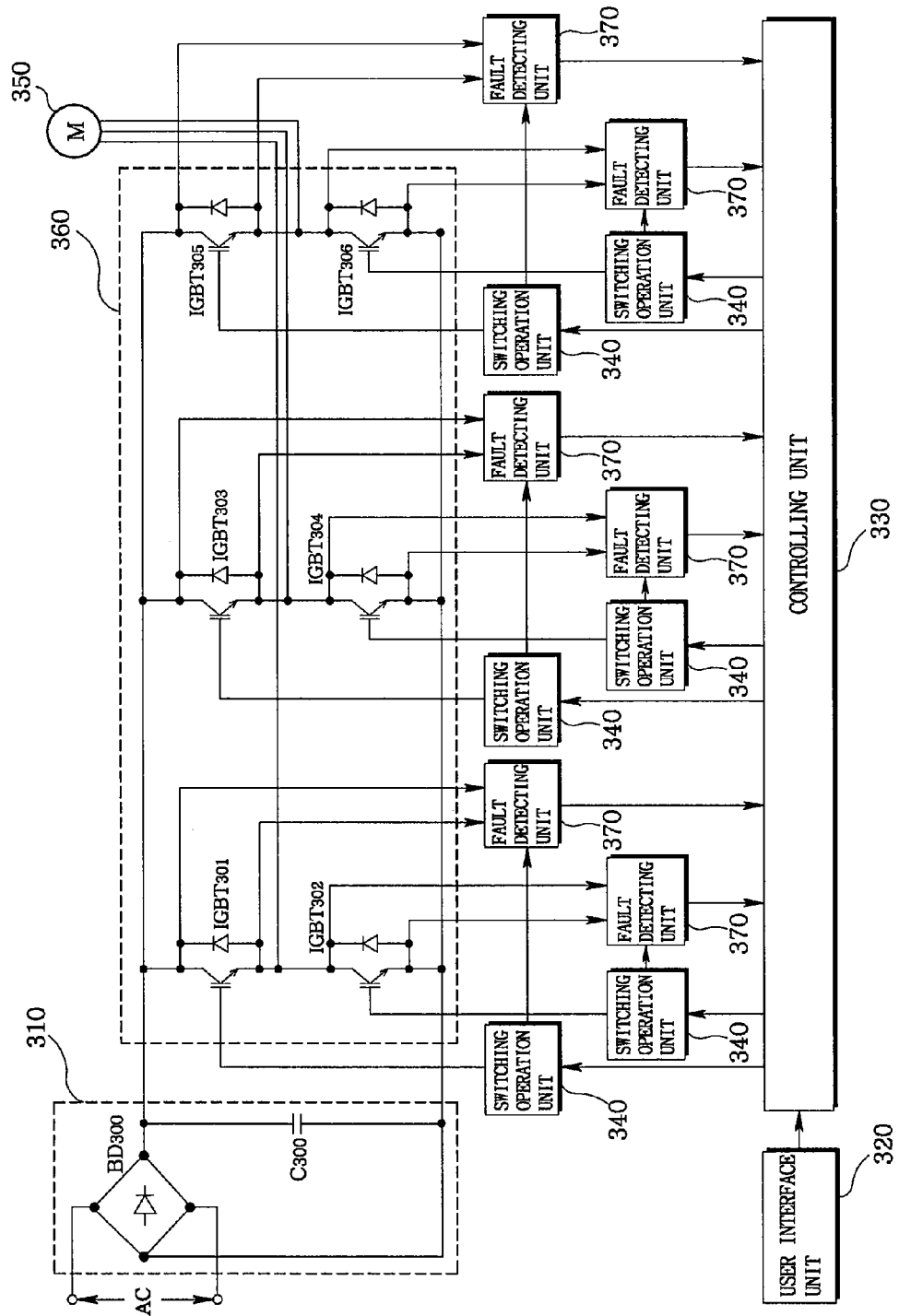
FIG. 3 is a circuit diagram showing the construction of the inverter in accordance with the present invention.

FIG. 3 is a circuit diagram showing the construction of the inverter in accordance with the present invention. Here, reference numeral 310 is a power supply unit. Said power supply unit 310 converts the inputted AC power into the ripple power by the bridge-rectification of the bridge diode $BD_{300}$, and said ripple power is converted into the DC power by smoothing by the smoothing condenser $C_{300}$.

Reference numeral 320 is a user interface unit. Said user interface unit 320 comprises a plurality of function keys and generates the corresponding action command according to the manipulation of the function keys by the user.

Reference numeral 330 is a controlling unit. Said controlling unit 330 controls the operation of the inverter according to the generated action command by said user interface unit 320. Further, said controlling unit 330 generates the switching control signal and operates the inverter, and when the fault of the inverter is detected, stops the motion of the inverter by cutting off said switching control signal.

Reference numeral 340 is a plurality of switching operation units. Said plurality of switching operation units 340 generate the switching signal, respectively, according to the switching control signal generated by said controlling unit 330.

Reference numeral 350 is a load such as the three-phase induction motor, and reference numeral 360 is a switching unit, wherein the switching elements ($IGBT_{101}$, $IGBT_{102}$) ($IGBT_{103}$, $IGBT_{104}$) ($IGBT_{105}$, $IGBT_{106}$) are connected between both terminals of said smoothing condenser 310 in series. And the gates of said switching elements ($IGBT_{101}$, $IGBT_{102}$) ($IGBT_{103}$, $IGBT_{104}$) ($IGBT_{105}$, $IGBT_{106}$) are connected to the output terminal of said plurality of switching operation unit 140 and thereby the switching signal outputted by the plurality of switching operation unit 140 is applied to the gates of the switching elements ($IGBT_{101}$, $IGBT_{102}$) ($IGBT_{103}$, $IGBT_{104}$) ($IGBT_{105}$, $IGBT_{106}$), respectively. Further, each connecting point of said switching elements ($IGBT_{101}$, $IGBT_{102}$) ($IGBT_{103}$, $IGBT_{104}$) ($IGBT_{105}$, $IGBT_{106}$) is connected to said load 250.

Reference numeral 370 is a plurality of fault detecting unit. Each said plurality of fault detecting units 370 are operated by the operating power respectively supplied by the plurality of switching operation units 340 when said plurality of switching operation units 340 generate the switching signal, respectively. Further, said plurality of fault detecting units 370 detect the voltage between the collector and the emitter of each plurality of switching elements $IGBT_{301}$~$IGBT_{306}$, respectively, and output the fault detecting signal to said controlling unit 330 by detecting whether or not the fault is generated using the level of the detected voltage.

The inverter of the present invention having such construction converts the inputted AC power into the ripple power by the bridge-rectification of the bridge diode $BD_{300}$ and converts the ripple power into the DC power by smoothing of the smoothing condenser $C_{300}$.

The DC power smoothed by said smoothing condenser $C_{300}$ is supplied to the switching unit 360 as the operating power.

In the above-mentioned state, if the user commands the operation of the inverter by controlling the user interface unit 320, the controlling unit 320 selectively generates a plurality of switching controlling signal. According to the switching control signal selectively generated by said controlling unit 320, a plurality of switching operation unit 340 generates the switching signal, and the generated switching signal is applied to the gate of the switching elements ($IGBT_{301}$, $IGBT_{302}$) ($IGBT_{303}$, $IGBT_{304}$) ($IGBT_{305}$, $IGBT_{306}$) of the switching unit 360, respectively.

Then, said switching elements ($IGBT_{301}$, $IGBT_{302}$) ($IGBT_{303}$, $IGBT_{304}$) ($IGBT_{305}$, $IGBT_{306}$) are selectively operated, and according to the selective operation of the switching elements ($IGBT_{301}$, $IGBT_{302}$) ($IGBT_{303}$, $IGBT_{304}$) ($IGBT_{305}$, $IGBT_{306}$) the three-phase power is supplied to the load 350 and operates it.

In such operation, said plurality of switching operation unit 340 generates the operating power, respectively, when the switching signal is generated according to the switching control signal, and the generated operating power is supplied to a plurality of fault detecting units 370, respectively, and thereby the generation of the fault is generated is to be detected.

Each plurality of fault detecting unit 370 detects the voltage between each collector and the emitter of said plurality of switching elements $IGBT_{301}$~$IGBT_{306}$ when the operating power is supplied from a plurality of switching operation units 340, respectively, and the plurality of fault detecting units 370 are operated. And each plurality of fault detecting unit 370 detects the generation of the fault of the inverter by comparing said detected voltage with the level of the predetermined reference voltage and when the generation of the fault is detected, generates the fault detecting signal and inputs it to the controlling unit 330.

Said controlling unit 330 judges the generation of the fault of the inverter when any one of said plurality of switching operation units 340 generates the fault detecting signal, cuts off the switching control signal and does not output the switching control signal any more. According to the cut off of said switching control signal by said controlling unit 330, the motion of the inverter is stopped and the damage of the load 350 due to the over current is prevented since a plurality of switching operation units 340 do not generate the switching signal, and thereby a plurality of switching elements $IGBT_{301}$~$IGBT_{306}$ do not operate.

Figure 4:
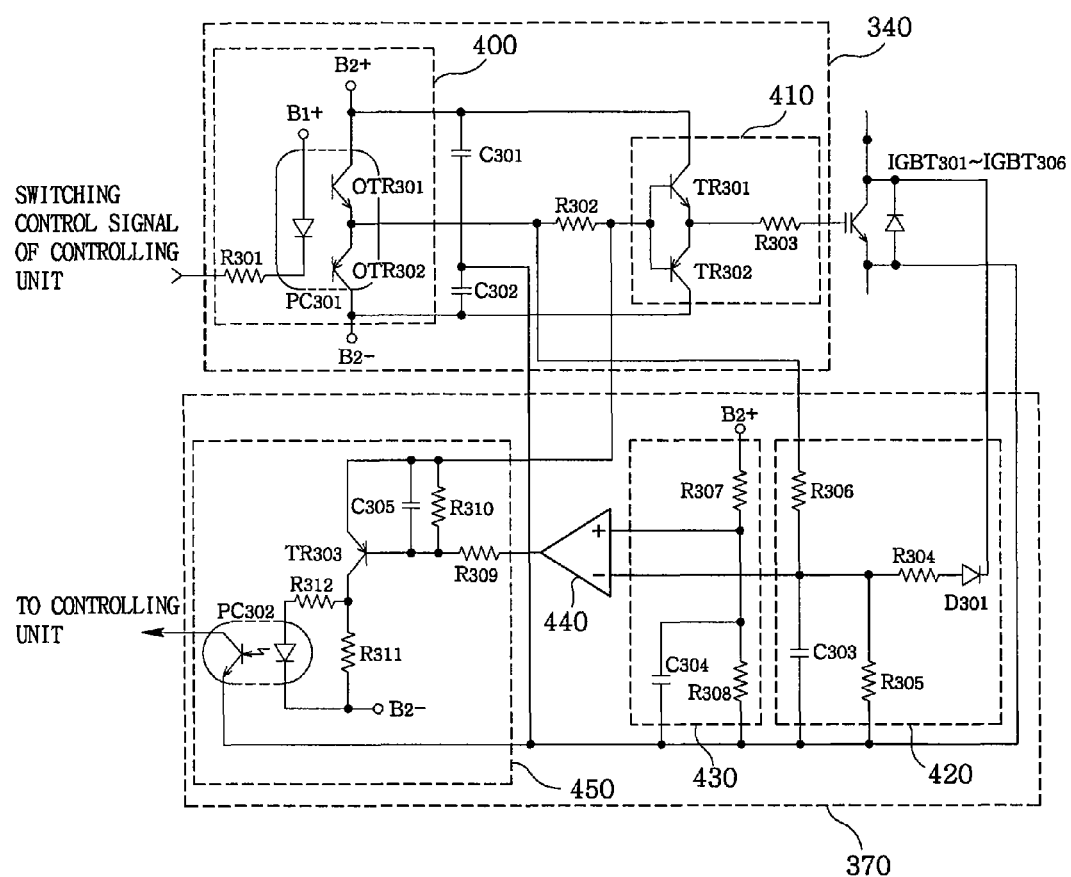
FIG. 4 is a circuit diagram showing the construction of a plurality of switching operation units and a plurality of fault detecting units of the inverter in accordance with the present invention.

FIG. 4 is a circuit diagram showing the construction of said plurality of switching operation units 340 and a plurality of fault detecting units 370 of the inverter in accordance with the present invention. Referring to FIG. 4, said plurality of switching operation units 340 comprise a switching control signal input unit 400, a switching control signal transmitting resistance $R_{302}$ and a switching signal output unit 410, respectively.

Said switching control signal input unit 400 connects the emitting unit of the photo coupler $PC_{301}$, and the resistance $R_{301}$ between the power terminal $B_1^+$ and the output terminal of the said controlling unit 330 in series and connects the light-emitting transistor $OTR_{301}$, $OTR_{302}$ of said photo coupler $PC_{301}$ between the power terminal $(B_2^+)$ $(B_2^-)$ in series. Each light-emitting transistor $OTR_{301}$, $OTR_{302}$ is NPN type and PNP type, and the emitters of the light-emitting transistors $OTR_{301}$, $OTR_{302}$ are connected to one side of the terminal of said switching control signal transmitting resistance $R_{302}$.

Said switching signal output unit 410 connects the transistors $TR_{301}$, $TR_{302}$ between the power terminal $(B_2^+)$ $(B_2^-)$ in series. Each transistor $TR_{301}$, $TR_{302}$ is NPN type and PNP type, and the emitters of the transistors $TR_{301}$, $TR_{302}$ are connected with each other. Further, the connecting point of said transistors $TR_{301}$, $TR_{302}$ are connected to the gate of said switching elements $IGBT_{301}$~$IGBT_{306}$ through the resistance $R_{303}$.

Said plurality of fault detecting unit 370 comprise a voltage detecting unit 420, a reference voltage unit 430, a comparator 440 and a fault detecting signal output unit 450, respectively.

Said voltage detecting unit 420 connects the diode $D_{301}$ and the resistors $R_{304}$, $R_{305}$ between the collector and the emitter of said switching elements $IGBT_{301}$~$IGBT_{306}$ in series and connects the condenser $C_{303}$ to the resistance $R_{305}$ in parallel. Further, the connecting point of said resistance $R_{304}$, $R_{305}$ and the condenser $C_{303}$ is connected to the inverting input terminal (−) of said comparator 440 and the connecting point of said light-emitting transistor $OTR_{301}$, $OTR_{302}$ and the switching control signal transmitting resistance $R_{302}$ is connected to the inverting input terminal (−) of said comparator 440 through the resistance $R_{306}$.

Said reference voltage unit 430 connects the resistance $R_{307}$, $R_{308}$ to the power terminal $(B_2^+)$ in series, connects the condenser $C_{304}$ to said resistance $R_{308}$ in parallel and connects the connecting point of the resistance $R_{307}$, $R_{308}$ and the condenser $(C_{304})$ to the non-inverting input terminal (+) of said comparator 440.

In said fault detecting signal output unit 450, the output terminal of said comparator 440 is connected to the base of the transistor $TR_{303}$ through the resistance $R_{309}$. And the connecting point of said switching control signal transmitting resistance $R_{302}$ and the bases of said transistors $TR_{301}$, $TR_{302}$ are connected to the emitter of the transistor $TR_{303}$ while being connected to the base of said transistor $TR_{303}$ through the resistance $R_{310}$ and the condenser $C_{305}$ connected in parallel. The resistance $R_{311}$ is connected between the collector of said transistor $TR_{303}$ and the power terminal $B_2^-$, and further, the resistance $R_{312}$ and the emitting unit of the photo coupler $PC_{302}$ are connected in series between the collector of said transistor $TR_{303}$ and the power terminal $B_2^-$, and thereby, the collector of the light-emitting transistor of the photo coupler $PC_{302}$ is connected to the input terminal of said controlling unit 330.

Among the description of FIG. 4, reference numeral $C_{301}$ and $C_{302}$ that are not described are condensers stabilizing the DC power applied to said power terminal $(B_2^+)$ $(B_2^-)$.

Such switching operation unit 340 and the fault detecting unit 370 stabilizes the DC power applied to the power terminal $(B_1^+)$ $(B_2^+, B_2^-)$ by the condensers $C_{301}$, $C_{302}$.

In the above-mentioned state, when the controlling unit 330 outputs the switching control signal, the emitting unit of the photo coupler $PC301$ of the switching control signal input unit 400 of the switching operation unit 340 is to be lighted and extinguished to the switching control signal, and the light-emitting transistors $OTR_{301}$, $OTR_{302}$ are selectively turned on and off according to the extinction and the lighting of said emitting unit.

Namely, when the switching control signal outputted from the controlling unit 330 is a low level signal, the current flows from the power terminal $B_1^+$ to the controlling unit 330 through the emitting unit of the photo coupler $PC_{301}$ and the resistance $R_{301}$ and lights the emitting unit of the photo coupler $PC_{301}$, and thereby, the light-emitting transistor $OTR_{301}$ is turned on. And when the switching control signal outputted from the controlling unit 330 is a high level signal, the emitting unit of the photo coupler $PC_{301}$ is extinguished, and thereby, the light-emitting transistor $OTR_{302}$ is turned on in opposition to the above-mentioned case.

Here, the present invention prevents from occurring the error of the controlling unit 330 due to the reverse current of the noise, etc. from the switching control signal input unit 400 to the controlling unit 330 by inputting the switching control signal outputted by the control unit 330 to the switching control signal input unit 400 through the photo coupler $PC_{301}$.

When said light-receiving transistor $OTR_{301}$ is turned on, the DC power of the power terminal $B_2^+$ is applied to the base of the transistor $TR_{301}$ through the light-receiving transistor $OTR_{301}$ and the switching control signal transmitting resistance $R_{302}$. Therefore, the switching elements $IGBT_{301} \sim IGBT_{306}$ become in the turned-on state by turning on the transistor $TR_{301}$ and applying the DC power of the power terminal $B_2^+$ to the gate of the switching elements $IGBT_{301} \sim IGBT_{306}$ through the transistor $TR_{301}$.

And when said light-receiving transistor $OTR_{301}$ is turned on, the switching elements $IGBT_{301} \sim IGBT_{306}$ become in the cut off state by turning on the transistor $TR_{302}$ because the low level signal is applied to the base of the transistor $TR_{302}$ and applying the low level signal to the gate of the switching elements $IGBT_{301} \sim IGBT_{306}$.

In such operations, as mentioned above, when the transistor $TR_{302}$ is turned on due to the turn on of the light-receiving transistor $OTR_{302}$ and said switching elements $IGBT_{301} \sim IGBT_{306}$ become in the cut off state, the fault detecting unit is not to be operated since the operating power is not supplied to the voltage detecting unit 420 and the fault detecting signal output unit 450 of the fault detecting unit 370.

Further, as mentioned above, when the transistor is turned on $TR_{301}$ due to the turning on of the light-emitting transistor $OTR_{301}$ and said switching elements $IGBT_{301} \sim IGBT_{306}$ become in the turn on state, the emitter voltage of said light-emitting transistor $OTR_{301}$ is supplied to said voltage detecting unit 420 as the operating power. Further, the voltage outputted to the emitter of the light-emitting transistor $OTR_{301}$ is supplied to the operating power to the fault detecting signal output unit 450 through the switching control signal transmitting resistance $R_{302}$, and thereby, the fault detecting unit 370 is to normally be operated.

When said fault detecting unit 370 is normally operated, the DC voltage supplied from said switching operation unit 340 to the voltage detecting unit 420 is charged at the condenser $C_{303}$ through the resistance $R_{306}$. Here, the charge time constant of the voltage detecting unit 420 is determined by the resistance $R_{305}$, $R_{306}$ and the value of the condenser $C_{303}$. The charge voltage of said condenser $C_{303}$ is applied to the inverting input terminal (−) of the comparator 440, and further, the charge voltage of said condenser $C_{303}$ is applied to the collector of the switching elements $IGBT_{301} \sim IGBT_{306}$ through the resistance $R_{304}$ and the diode $D_{301}$.

Therefore, the voltage applied to the inverting input terminal (−) of said comparator 440 is clamped according to the voltage of both ends of the collector and the emitter of the switching elements $IGBT_{301} \sim IGBT_{306}$.

The reference voltage unit 430 of the fault detecting unit divides the DC voltage of the power terminal $B_2^+$ by the resistance $R_{307}$, $R_{308}$, and the voltage of both ends of the resistance $R_{308}$ is stabilized by the condenser $C_{304}$ and is applied to the non-inverting input terminal (+) of the comparator 440 as the reference voltage.

Here, when the power less than normal level flows into said switching elements $IGBT_{301} \sim IGBT_{306}$, the resistance $R_{305} \sim R_{308}$ and the values of the condensers $C_{303}$, $C_{304}$ are established so that the voltage applied to the inverting input terminal (−) of the comparator 440 is lower than the voltage applied to the non-inverting input terminal (+) of the comparator 440.

Then, when the power less than a normal level flows into said switching elements $IGBT_{301} \sim IGBT_{306}$, the voltage applied to the inverting input terminal (−) of said comparator 440 becomes lower than the voltage applied to the non-inverting input terminal (+). Accordingly, the transistor $TR_{303}$ of the fault detecting signal output unit 450 becomes in the cut off state by outputting the high level signal by the comparator 440, and the light-receiving transistor becomes in the cut off state since the emitting unit of the photo coupler $PC_{302}$ cannot be lighted, and the fault detecting signal is not to be outputted.

On the contrary, when the over power more than normal level flows into said switching elements $IGBT_{301} \sim IGBT_{306}$, the voltage of both ends of the collector and the emitter of the switching elements $IGBT_{301} \sim IGBT_{306}$ are increased according to the operating characteristic of the switching elements $IGBT_{301} \sim IGBT_{306}$, and the voltage applied to the inverting input terminal (−) of said comparator 440 becomes higher than the voltage applied to the non-inverting input terminal (+) due to the increase of the charge voltage of the condenser $C_{303}$.

Then, as a result of the comparison, the comparator 440 outputs the low level signal and the transistor $TR_{303}$ becomes in the turn on state, and thereby, the emitting unit of the photo coupler $PC_{302}$ is lighted, and the light-receiving transistor is turned on and the fault detecting signal is outputted to the controlling unit 330.

Here, the present invention prevents from occurring the error due to the influx of the noise together with the fault detect signal to the controlling unit 330 by outputting the fault detecting signal through the photo coupler $PC_{302}$ by the fault detecting signal output unit 450 and inputting it into the controlling unit 330.

As mentioned above, if the fault detecting signal is outputted to the controlling unit 330, the controlling unit 330 does not output the switching control signal. Then, the damage of the load 350 by the over current can be prevented since a plurality of switching operation units 340 do not generate the switching signal and a plurality of switching elements $IGBT_{301} \sim IGBT_{306}$ do not perform the switching operation.

Meanwhile, although the present invention is illustrated and described in connection with a certain preferred embodiments in the above, it can easily be known that the present invention could variously be reconstructed and changed within the limitation without departing from spirit and the scope of the present invention provided by the claims in the below by those skilled in the field.

As mentioned above, the present invention detects whether the fault is generated or not by using the operation characteristic for increasing the voltage of both ends of the collector and the emitter of the switching device when the over current flows into the switching device. The present invention may exactly detect the generation of the fault and exactly judge the portion wherein the fault is occurred by respectively detecting the generation of the fault in each switching elements.

Further, the present invention may provide a cheap gate operating device that can simply set the reference voltage since the generation of the fault is judged by using the comparator and almost is not effected by the noise by being constructed by the analog devices and exactly detects the generation of the fault and stops the operation of the switching element during the glitch and generate the fault signal.

The present invention only describes the recited specific examples in detail; however, the possibility of various modification and revision within the scope of the spirit of the present invention will be apparent to those skilled in the art, and it is natural that such modification and revision belong to the attached claims.

What is claimed is:

1. An inverter, comprising:
    a switching unit supplying AC power to a load as a plurality of switching devices switches DC power according to a relevant switching signal;
    a plurality of switching operation units that generates a plurality of switching signals controlling operations of the plurality of switching devices of the switching unit in response to a relevant switching control signal, and that generates a first voltage and a second voltage, each having a predetermined different voltage difference;
    a plurality of fault detecting units respectively generating a fault detecting signal having information on whether a fault has been generated, using the first voltage, the second voltage, and voltages of both ends of a relevant switching device out of the plurality of switching devices; and
    a controlling unit that generates said switching control signal and outputs said switching control signal to a switching operation unit when said load is operated and cuts off said switching control signal when at least one among said plurality of fault detecting units detects the generation of the fault,
    wherein, each of the switching operation units includes:
        a switching control signal input unit generating and outputting the first voltage corresponding to the switching control signal, using a first power source, a second power source and a third power source,
        a switching control signal transmitting resistance generating the second voltage by dropping a voltage level of the first voltage applied to one terminal, and
        a switching signal output unit generating the switching signal corresponding to the second voltage, using a second power source and a third power source, and
    wherein, each of the fault detecting units includes:
        a voltage detecting unit generating a comparison voltage, using the first voltage and the voltages of both ends of relevant switching device,
        a reference voltage unit generating a reference voltage, using the second power source and the relatively low third voltage out of the voltages of both ends of relevant switching device,
        a comparator generating a comparative result signal by comparing the comparative voltage and the reference voltage, and
        a fault detecting signal output unit generating the fault detecting signal corresponding to the comparative result signal, using the second voltage, the third voltage and a relatively low voltage of the voltages of both ends of relevant switching device.

2. The inverter according to claim 1,
    wherein the switching control signal input unit includes:
        a first photo coupler generating the first voltage corresponding to the switching control signal inputted via a first resistance, and
    wherein the switching signal output unit includes:
        an NPN transistor and one terminal connected to the second power source and a base applied with the second voltage,
        a first PNP transistor with one terminal connected to an other one terminal of the NPN transistor and the second voltage connected the base, the other one terminal connected to the third power source, and
        an output resistance with one terminal connected to a common terminal of the NPN transistor and the PNP transistor, and generating the switching signal to the other one terminal.

3. The inverter according to claim 2,
    wherein the voltage detecting unit includes:
        a diode in which an N type terminal is connected to a relatively high voltage out of the voltages of both ends of the relevant switching device,
        a fourth resistance in which one terminal is connected to a P terminal of the diode,
        a fifth resistance in which one terminal is connected to a relatively low voltage out of the voltages of both ends of the relevant switching device, and an other one terminal of the fifth resistance is connected to an other one terminal of the fourth resistance,
        a sixth resistance in which one terminal is connected to the first voltage, and an other one terminal of the sixth resistance is connected to a common terminal between the fourth resistance and the fifth resistance that generates the comparative voltage, and
        a third condenser, and
    wherein the reference voltage unit includes:
        a seventh resistance in which one terminal is connected to the second power source,
        an eighth resistance in which one terminal is connected to the third power source, and an other one terminal of the eighth resistance is connected to an other one terminal of the seventh resistance that generates the reference voltage, and
        a fifth condenser in which one terminal is connected to the third power source, and an other one terminal of the fifth condenser is connected to a common terminal between the seventh resistance and the eighth resistance, and
    wherein the fault detecting signal output unit includes:
        a ninth resistance in which one terminal is connected to an output terminal of the comparator,
        a tenth resistance in which one terminal is connected to the second voltage and an other one terminal of the tenth resistance is connected to an other one terminal of the ninth resistance,
        a fifth condenser connected in parallel with the tenth resistance,
        a second PNP transistor in which one terminal is connected to the second voltage, and a base terminal is connected to the other one terminal of the ninth resistance,
        an eleventh resistance in which one terminal is connected to an other one terminal of the second PNP transistor, and an other one terminal of the eleventh resistance is connected to the third power source,
        a twelfth resistance for dropping the voltage level at a common terminal between the PNP transistor and the eleventh resistance, and
        a second photocoupler generating the fault detecting signal corresponding to the low voltage out of the voltages of both ends of relevant switching device, using the dropped voltage by the third power source and the twelfth resistance.

* * * * *